(12) United States Patent
Basore

(10) Patent No.: US 6,518,596 B1
(45) Date of Patent: Feb. 11, 2003

(54) FORMATION OF CONTACTS ON THIN FILMS

(75) Inventor: Paul Alan Basore, New South Wales (AU)

(73) Assignee: Pacific Solar Pty Ltd., New South Wales (AU)

( * ) Notice: Subject to any disclaimer, the term of this patent is extended or adjusted under 35 U.S.C. 154(b) by 0 days.

(21) Appl. No.: 10/129,326

(22) PCT Filed: Oct. 31, 2000

(86) PCT No.: PCT/AU00/01335

§ 371 (c)(1),
(2), (4) Date: May 6, 2002

(87) PCT Pub. No.: WO01/33639

PCT Pub. Date: May 10, 2001

(30) Foreign Application Priority Data

Nov. 4, 1999 (AU) .............................................. PQ 3858

(51) Int. Cl.[7] .............................................. H01L 29/76
(52) U.S. Cl. ........................ 257/69; 257/350; 438/151; 438/640
(58) Field of Search ................................ 438/149, 151, 438/164, 479, 637, 639, 640; 257/69, 72, 347, 349, 350

(56) References Cited

U.S. PATENT DOCUMENTS

| 5,940,732 A | * | 8/1999 | Zhang .......................... 438/640 |
| 6,077,730 A | | 6/2000 | Lee et al. .................... 438/151 |
| 6,107,642 A | | 8/2000 | Sundaresan ................... 257/69 |
| 6,285,041 B1 | * | 9/2001 | Noguchi ....................... 257/350 |
| 6,410,358 B1 | * | 6/2002 | Noritake et al. ............. 438/151 |

FOREIGN PATENT DOCUMENTS

| EP | 660392 | 6/1995 |
| WO | WO00/22681 | 4/2000 |

* cited by examiner

Primary Examiner—Chandra Chaudhari
(74) Attorney, Agent, or Firm—Jordan and Hamburg LLP

(57) ABSTRACT

A simple thin film provided on a substrate which supports a semiconductor device structure, over which is formed a dielectric barrier and a composite metal film contact structure. Contacts are formed by creating holes in the dielectric barrier at locations where contact to an upper region of the semiconductor material is required, and then forming a first metal film extending into the holes to contact a top region of the semiconductor structure. A second set of holes are created to expose an underlying opposite polarity region. Surfaces at the second holes are doped and a second metal film is formed to contact the underlying semiconductor region. The metal structure is then scribed to isolate the contacts to the upper and lower semiconductor regions.

77 Claims, 6 Drawing Sheets

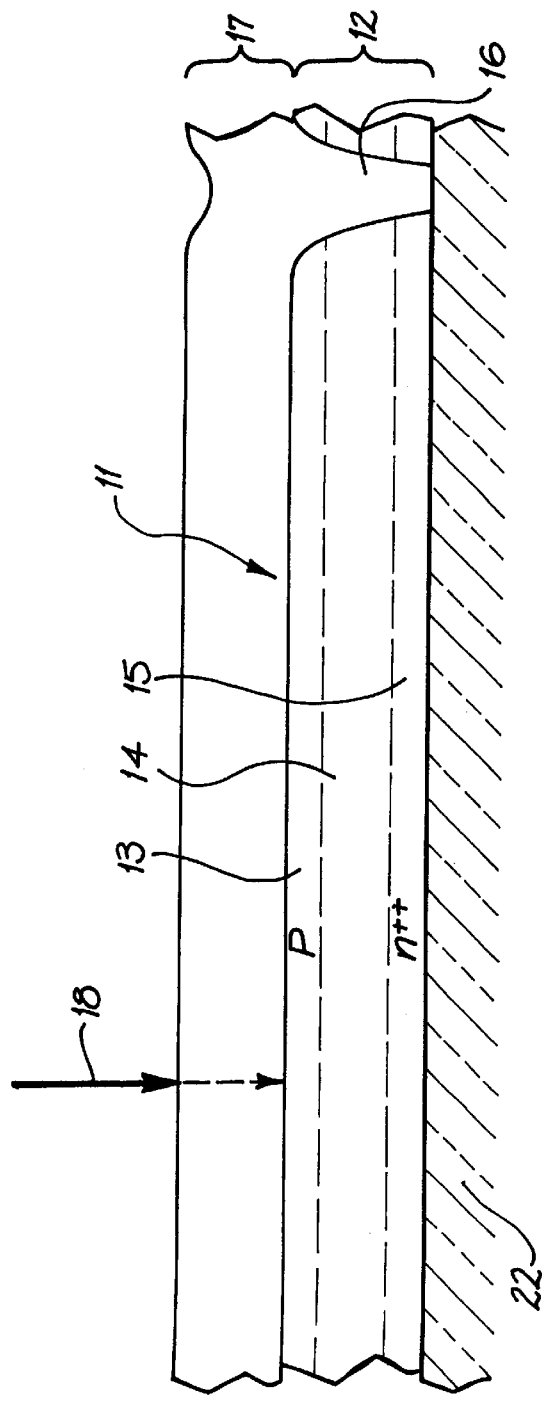
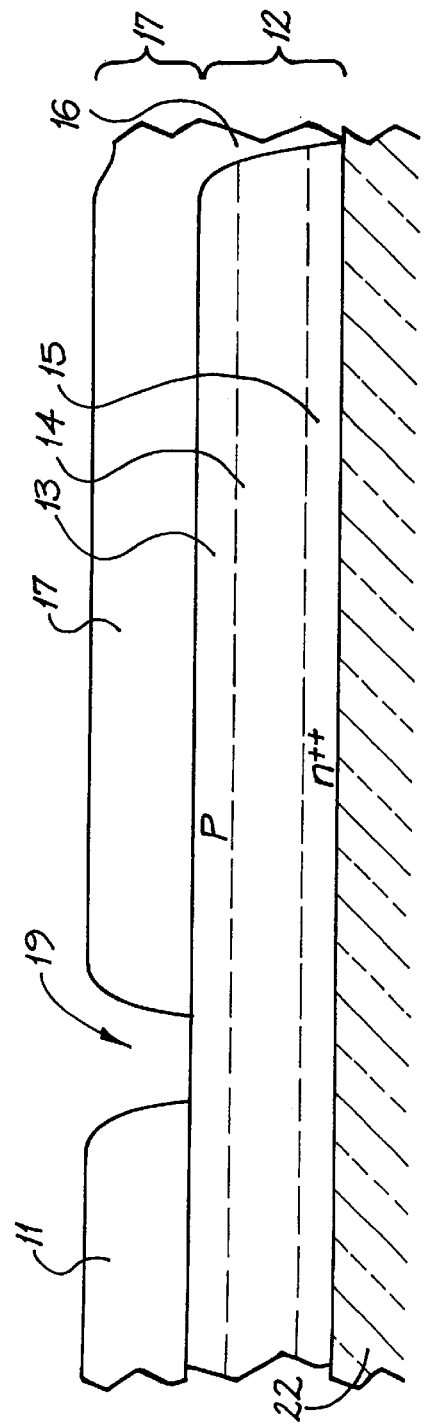
FIG. 1
FIG. 2

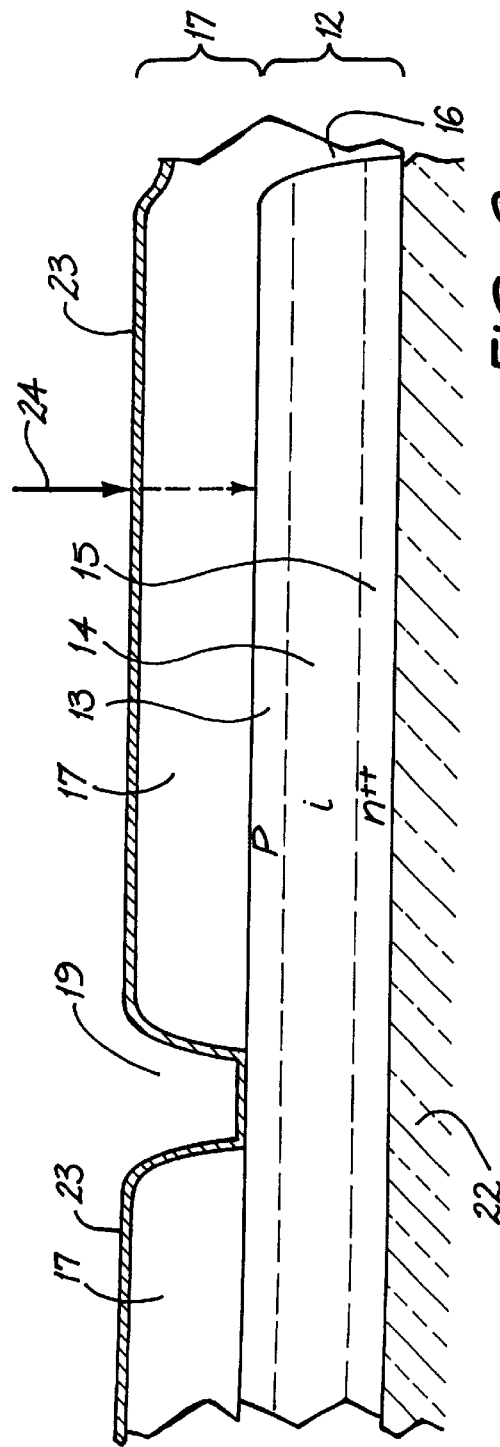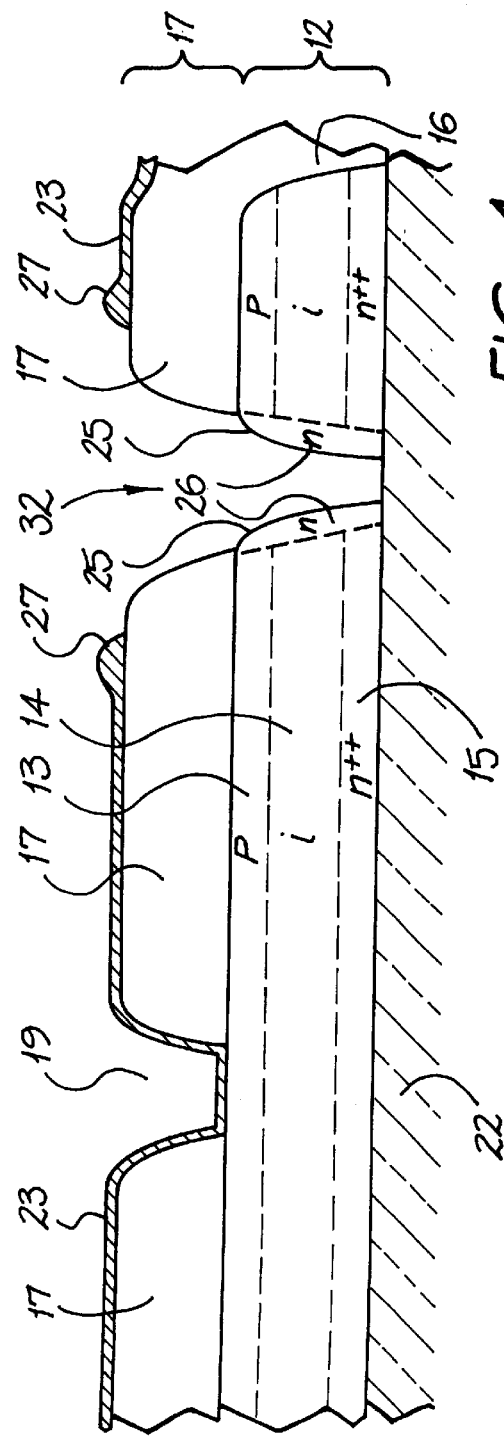

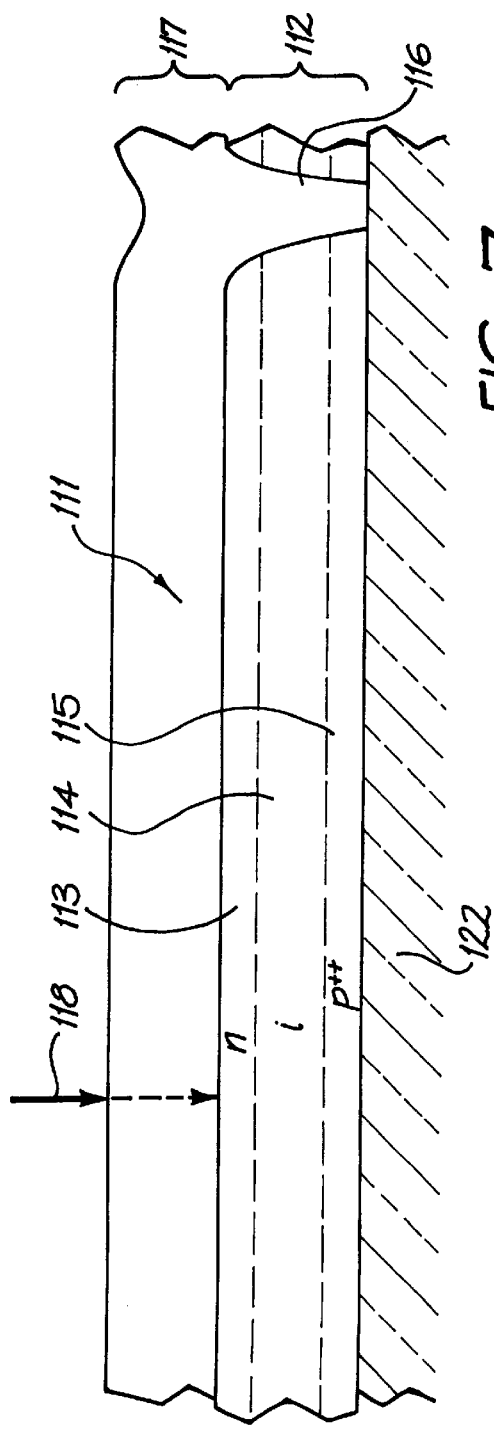
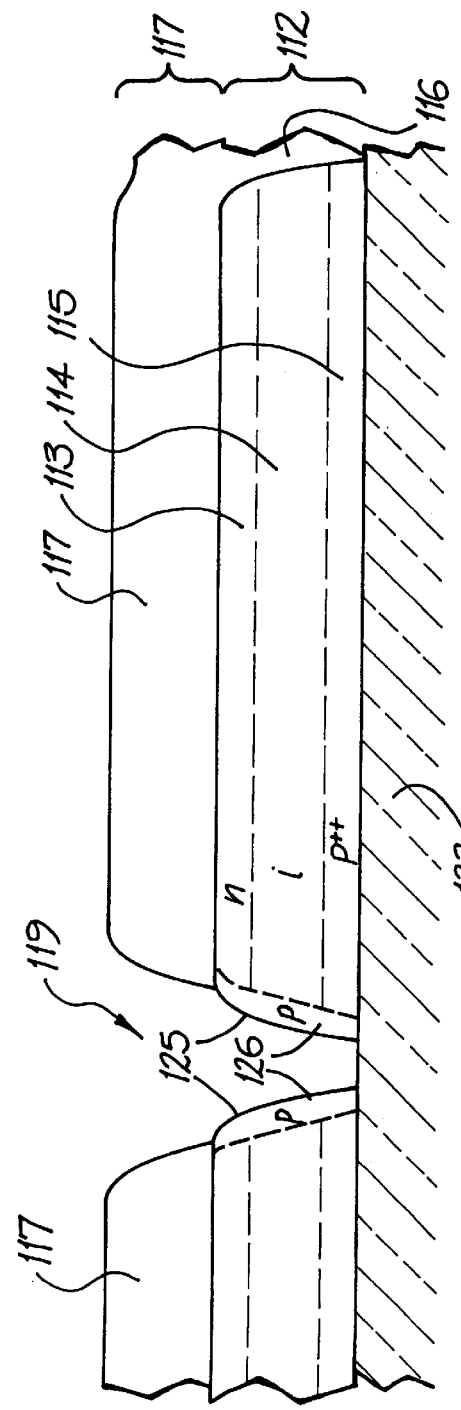

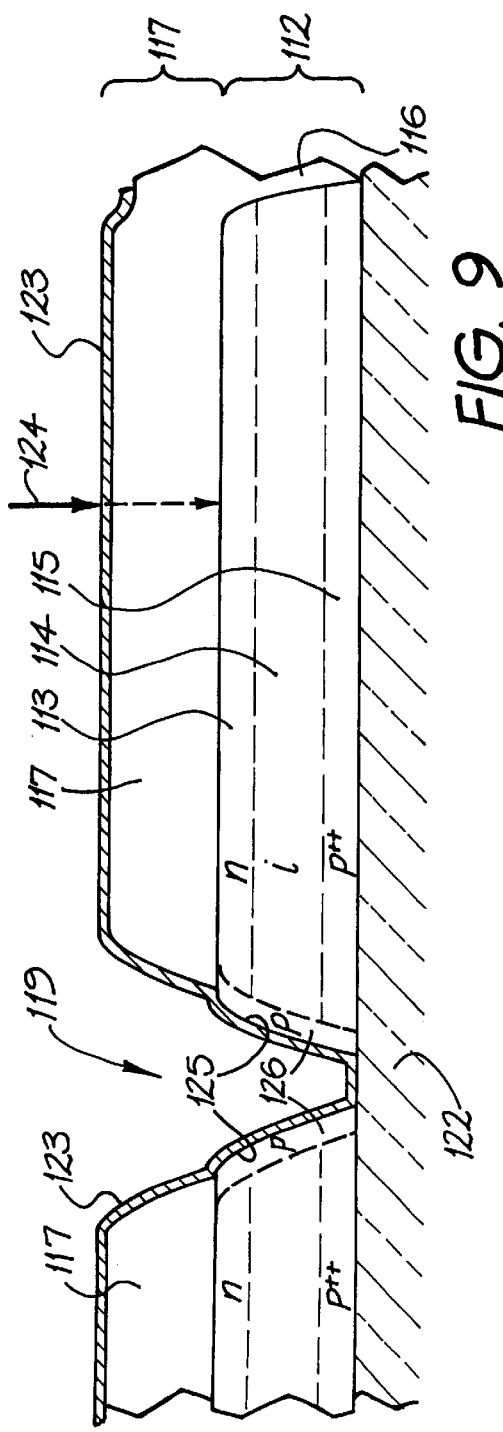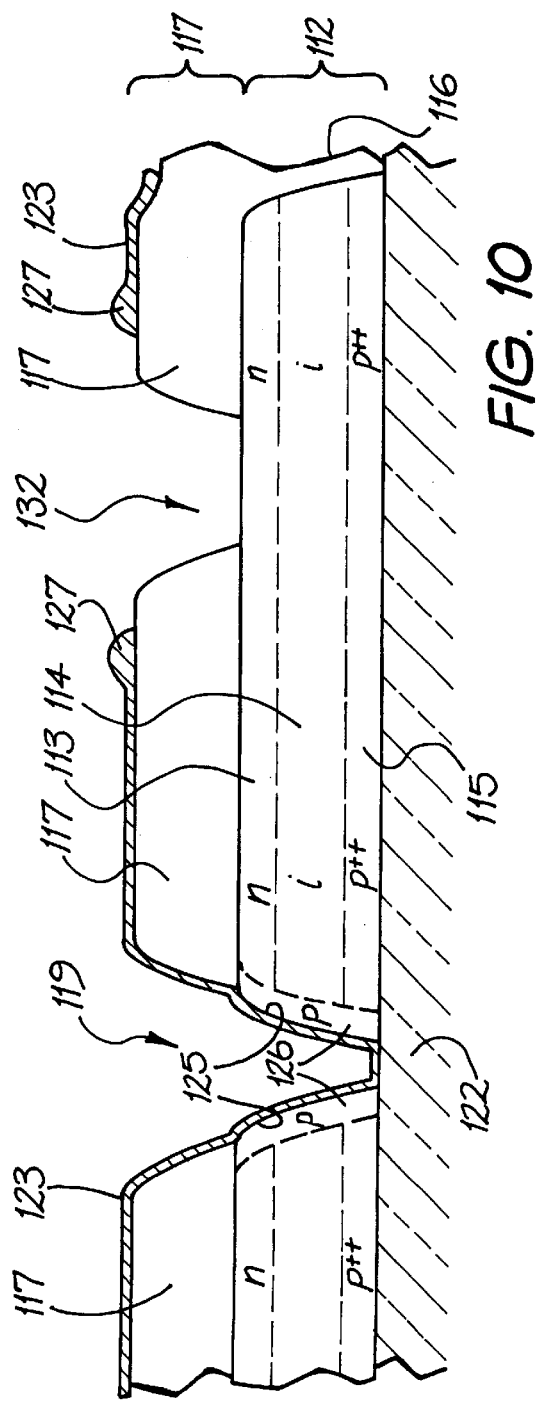

FORMATION OF CONTACTS ON THIN FILMS

FIELD OF THE INVENTION

The present invention relates generally to the field of semiconductor device fabrication and in particular the invention provides an improved device structure and method of forming metal contacts in thin film semiconductor devices.

BACKGROUND OF THE INVENTION

A major advantage of thin-film photovoltaic (PV) modules over conventional wafer-based modules is that series interconnection of the individual cells can be accomplished using a deposited metal film. It is known that particular metals make better contact with regions of one dopant type and in particular, aluminium which is commonly used as a metallisation layer makes good contact with n-type material, but can be unreliable when contacting to p-type material unless high temperatures are used.

However, cost is an important factor in thin film device manufacture and additional steps can add significantly to the cost particularly when they include an alignment step. Therefore, processes that avoid alignment steps, or are self aligning, provide significant advantages in low cost device fabrication.

SUMMARY OF THE INVENTION

According to a first aspect, the present invention provides a method of forming p-type and n-type contacts on a thin film semiconductor junction device having an underlying region of a first semiconductor type and an overlying region of a second semiconductor type including the steps of:

a) forming at least one dielectric layer over a free surface of the thin film device;

b) opening a first set of holes in the dielectric layer to expose the upper semiconductor region of the second semiconductor type in the locations where contacts are to be made to the second semiconductor type;

c) forming a first thin metal layer over the at least one dielectric layer and extending into the first set of openings to contact with the second semiconductor type, the first metal layer being formed of a metal selected to make reliable contact with the second semiconductor type;

d) opening a second set of holes through the first metal layer and the dielectric layer to expose a surface of the semiconductor;

e) doping the surface or surfaces of the semiconductor device exposed by the second set of holes in the dielectric layer with a dopant of the same polarity as the underlying region, the further doping extending to the underlying region and isolating the second set of holes from the upper semiconductor region;

f) forming a second thin metal layer over the first metal layer, the second metal layer extending into the openings in the at least one dielectric layer and contacting the surface or surfaces of the semiconductor material exposed by the second set of holes to thereby provide a connection to the underlying semiconductor region; and g) for each cell in the device, forming an isolation groove through both metal layers to electrically isolate the contacts in the first set of openings from the contacts in the second set of openings.

The doping step, to dope the second set of openings may be either as a direct consequence of opening the second set of holes or as a subsequent process step. However, in the preferred embodiment, the doping of the surfaces of the second set of openings is performed as part of the opening step. Preferably, the opening created by the second opening step extends through the first metal layer, the one or more dielectric layers and through the semiconductor film to expose a supporting surface on which the semiconductor film is formed.

According to a second aspect, the present invention provides a method of forming p-type and n-type contacts on a thin film semiconductor junction device having an underlying region of a first semiconductor type and an overlying region of a second semiconductor type including the steps of:

a) forming at least one dielectric layer over a free surface of the thin film device;

b) opening a first set of holes through the at least one dielectric layer to expose a surface of the semiconductor in the locations where contacts are to be made to the underlying region of the first semiconductor type;

c) doping the surface or surfaces of the semiconductor device exposed by the first set of holes in the at least one dielectric layer with a dopant of the same polarity as the underlying region, the further doping extending to the underlying region and isolating the first set of holes from the upper semiconductor region;

d) forming a first thin metal layer over the at least one dielectric layer and extending into the first set of openings to contact with the first semiconductor type, the first metal layer being formed of a metal selected to make reliable contact with the first semiconductor type;

e) opening a second set of holes through the first metal layer and the at least one dielectric layer to expose the upper semiconductor region of the second semiconductor type in the locations where contacts are to be made to the second semiconductor type;

f) forming a second thin metal layer over the first metal layer, the second metal layer extending into the openings in the at least one dielectric layer and contacting the surface or surfaces of the semiconductor material exposed by the second set of holes to thereby provide a connection to the upper semiconductor region; and g) for each cell in the device, forming an isolation groove through both metal layers to electrically isolate the contacts in the first set of openings from the contacts in the second set of openings.

The doping step, to dope the first set of openings may be either as a direct consequence of opening the first set of holes or as a subsequent process step. However, in the preferred embodiment, the doping of the surfaces of the first set of openings is performed as part of the opening step. Preferably, the opening created by the first opening step extends through the one or more dielectric layers and through the semiconductor film to expose a supporting surface on which the semiconductor film is formed.

According to a third aspect, the present invention provides a thin film semiconductor device comprising a thin semiconductor film formed on a transparent insulating substrate, the semiconductor film having at least an upper doped region of a first dopant type located adjacent an upper surface of the semiconductor film remote from the substrate, and an underlying doped region of a dopant type of opposite polarity to the first dopant type between the upper doped region and the substrate, at least one dielectric layer extending over the semiconductor film, a first thin layer of a first metal extending over the dielectric layer and a second thin layer of a second metal different to the first metal extending over and in contact with the first metal layer, a first set of openings being provided in the at least one dielectric layer such that the first metal layer contacts the semiconductor region of one dopant type to make electrical connection therewith in the first set of openings, and a second set of openings being provided in the at least one dielectric layer and the first metal layer such that the second metal layer extends into the second set of openings in the at least one dielectric layer and contacts a region of the semiconductor film, of the opposite dopant type, the first metal being selected to make reliable connection with the semiconductor material exposed by the first set of openings and the second metal being selected to make reliable connection with the semiconductor material exposed by the second set of openings.

In the preferred embodiment, the second set of openings extends completely through the semiconductor film to expose a supporting surface on which the semiconductor film is formed. These openings allow direct contact to the underlying semiconductor region. The preferred method of forming these openings also causes the walls of the openings to be simultaneously doped with the same dopant polarity as the underlying region to which contact is being made, thereby isolating the overlying, oppositely doped region from the surfaces of the openings. In a preferred method of forming the openings, a laser is used to melt/ablate the opening and the doped walls of the opening are formed by mixing of the material from the underlying region with the material in the walls during the formation of the openings.

The first metal layer will also form the back reflector of the photovoltaic device and is therefore preferably selected for good optical reflectivity. Alternatively the first metal layer can be made sufficiently thin that it is essentially transparent, in which case the optical reflectivity is determined primarily by the second metal layer.

In embodiments where the semiconductor is silicon, such as in thin polycrystalline silicon devices, the metals are preferably selected from aluminium, copper and nickel. As nickel and copper each make better contact with p-type silicon material than aluminium it is preferable that one of these metals be used as the first metal layer, to provide contact to a p-type region. Aluminium is adequate for connecting to n-type material and has a low melting point which assists in forming metal isolation grooves.

The at least one dielectric layer can be any one or more of the dielectric materials commonly used in semiconductor manufacture such as silicon dioxide, or silicon nitride, an organic resin such as Novolac™, or a layered combination of these.

Typically, the dielectric layer is an order of magnitude thicker than the second metal layer and the first metal layer is an order of magnitude thinner than the second metal layer.

In thin silicon film photovoltaic devices, the silicon film is typically in the range of 0.5–10 $\mu$m thick and is formed over a glass substrate. Preferably, the silicon film will be in the range of 1–3 $\mu$m thick.

In the case of Novolac™, the dielectric layer will be in the range of 1–10 $\mu$m and preferably 2–5 $\mu$m while the nickel or copper will be 5–20 nm thick and the aluminium will be 100–200 nm thick. A thin (100–200 nm) layer of silicon nitride is preferably formed between the Novolac™ and the silicon.

Preferably, the opening of the dielectric layer to form the first and second sets of openings and the opening of the isolation grooves in the metal is performed by a laser although it is also possible to perform some of these operations by masking and etching or mechanical scribing, depending on the materials used.

It is known that some metals will make a reliable connection with a particular doped semiconductor, while other metals will make intermittent electrical connection with the same doped semiconductor or will only sometimes make connection. Still other metals will make no useful electrical connection with the given semiconductor. Further, metals which make good electrical connection with one doped semiconductor type, may not make satisfactory electrical connection to an oppositely doped semiconductor type. Throughout this specification, the term "reliably make electrical connection", when used in relation to selection of metals for electrical contacts, will be taken to indicate that the metal is selected for its reliability in consistently making good electrical connection within the design parameter of the device, to the particular doped semiconductor material in use.

BRIEF DESCRIPTION OF THE DRAWINGS

Embodiments of the invention will now be described by way of example with reference to the accompanying drawings in which:

FIG. 1 is a sectional view through a semiconductor device after a first step of a first embodiment, the method of the present invention has been applied;

FIG. 2 is a sectional view through a semiconductor device after a first opening step of the invention has been applied according to the first embodiment;

FIG. 3 is a sectional view through a semiconductor device after a first metallisation step of the invention has been applied according to the first embodiment;

FIG. 4 is a sectional view through a semiconductor device after a second opening step of the invention has been applied according to the first embodiment;

FIG. 7 is a sectional view through a semiconductor device after a first step of a second embodiment, the method of the present invention has been applied;

FIG. 8 is a sectional view through a semiconductor device after a first opening step of the invention has been applied according to the second embodiment;

FIG. 9 is a sectional view through a semiconductor device after a first metallisation step of the invention has been applied according to the second embodiment;

FIG. 10 is a sectional view through a semiconductor device after a second opening step of the invention has been applied according to the second embodiment.

DETAILED DESCRIPTION OF EMBODIMENTS OF THE INVENTION

Figure 5:
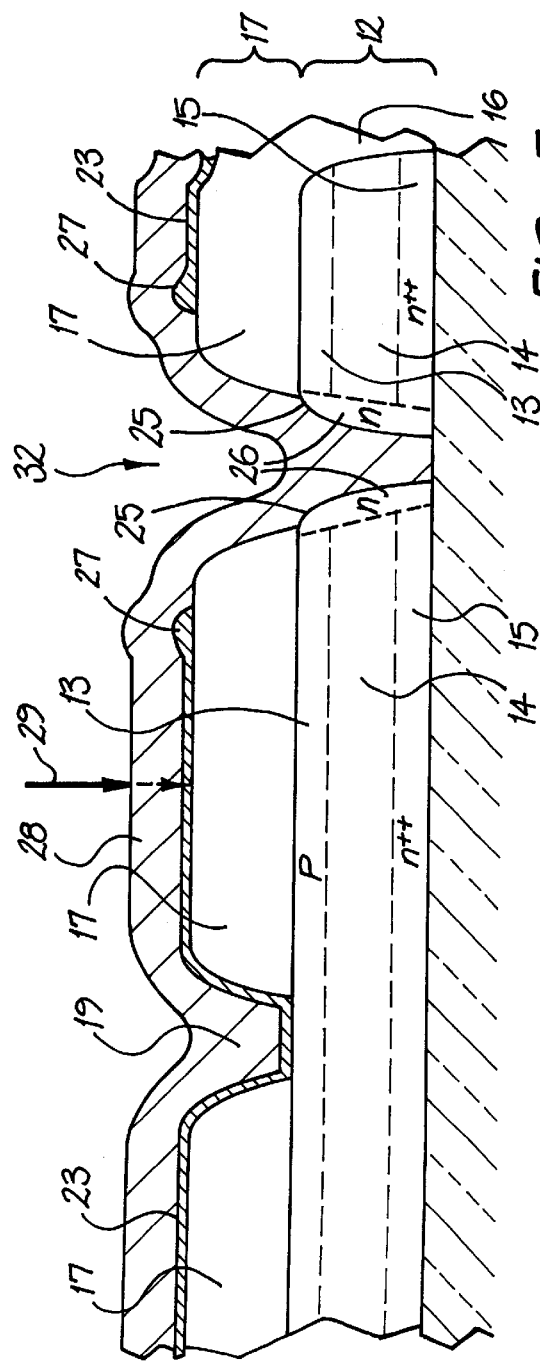
FIG. 5 is a sectional view through a semiconductor device after a second metallisation step of the invention has been applied according to the first embodiment.

Referring to the drawings, FIG. 1 illustrates a part of a semiconductor device structure 11 which is a precursor to the process of the present invention with a first step of the invention applied. The semiconductor device is a photovoltaic module comprising a thin polycrystalline silicon film 12 formed on a glass substrate 22 covered with a thin anti-reflection coating 12 formed on a glass substrate 22 covered with a thin anti-reflection coating and having an upper p-type region 13, a lower $n^{++}$ type region 15 and an intrinsic or lightly doped region 14 separating the p and n-type regions. The silicon film 12 is separated into cells by scribed isolation grooves 16. The glass surface is preferably textured to promote light trapping, but this is not shown in the figures for sake of clarity.

The first step of the method according to the present invention, is the formation of a dielectric layer 17 over the thin silicon film 12. Preferably, the dielectric layer is a two layer film composed of a thin (150 nm) layer of silicon nitride plus an organic resin known as Novolac™, which is formed to a thickness in the order of 2.5 μcm.

A first set of holes 19 (ref FIG. 2) are then formed in the dielectric layer 17 by heating the regions to be opened with a laser 18. The laser locally heats the underlying silicon which causes the Novolac™ to erupt leaving a hole 19 exposing the silicon beneath. Heat treatment can be used subsequently to smooth the edge of the dielectric layer surrounding the hole if necessary.

Turning to FIG. 3, a thin metal layer 23 is then deposited over the dielectric layer 17 and extends into the holes 19 to contact with the p-type region 13. The thin metal layer 23 is preferably of nickel, or copper and is typically in the order of 10 nm, serving both as the contact to the p-type region 13 and as a back reflector. Copper is a superior optical reflector to nickel and both metals make reliable contacts with p-type silicon. However, nickel does not adhere to Novolac™ as strongly as does copper, a fact which assists in subsequent formation of metal isolation grooves.

A laser 24 (ref. FIG. 3) is employed to open holes through the thin metal layer 23, dielectric layer 17, and semiconductor layers 13, 14, 15 to form an opening 32, as is illustrated in FIG. 4, extending through the silicon film 12 to the glass substrate 22.

When the opening 32 is formed, the very thin metal layer 23 in the vicinity of the opening is caused to evaporate from the area surrounding the opening 32 and the remaining molten metal shrinks back to form a thickened portion 27 such that the opening in the metal layer 23 is 2–3 times the diameter of the openings in the silicon.

As also illustrated in FIG. 4, the silicon surfaces 25 exposed by the opening 32, are doped with n-type dopant as a result of the laser process which forms the hole 26, to isolate the opening 32 from the p-type region 13 and to provide a surface for formation of the n-type contact. The walls become doped n-type because in these regions during the laser pulse, the semiconductor film is melted and all dopants in the film are mixed together. Because there are more n-type dopants in the film that p-type dopants, the walls of the hole solidify with n-type polarity.

Referring to FIG. 5, the n-type contact is formed by a second thin metal layer 28 formed over the first thin metal layer 23, the second metal layer 28 extending into the opening 32 and contacting the surfaces 25 of the opening 32.

The openings 16 and 32 are either elongate grooves or spaced holes so that lateral continuity is maintained in the semiconductor layer.

Figure 6:
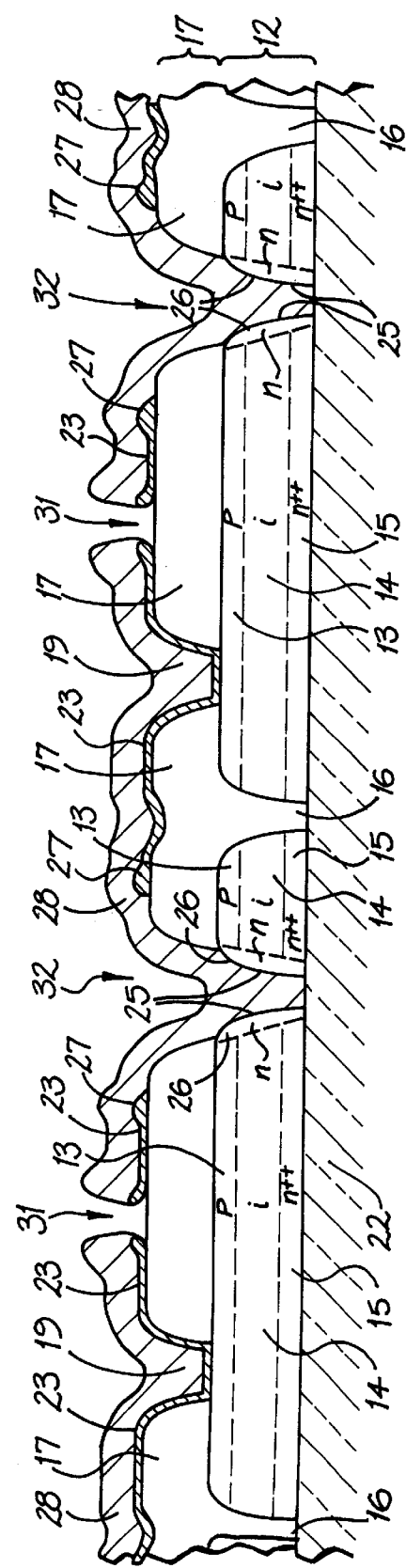
FIG. 6 is a sectional view through a semiconductor device after the metallisation formed in accordance with the first embodiment has been interrupted to separate the contacts to the p & n type regions.

The final step in the process is the isolation of the n-type and p-type contacts which is achieved by using a laser 29 to melt and/or evaporate the metal layers 23 and 28 to thereby form an isolation groove 31 as seen in FIG. 6.

When the laser is pulsed on, a small amount of metal is ablated directly under the beam and surface tension in the surface of molten metal surrounding the ablated region pulls the metal back from the hole causing a slight thickening of the metal around the hole, and creates a hole 31 which is significantly larger in diameter than the ablated region. Because the adhesion of the nickel layer 23 to the underlying dielectric which is in this case, an organic resin known as Novolac™, is not as great as is the case for aluminium, the combined aluminium and nickel layer 23. 28 peels back more readily than would be the case if aluminium alone were used. By pulsing the laser on centres spaced at a regular pitch, a series of joined holes, surrounded by a pair of metal mounds, are formed to provide a continuous gap separating two regions of the metal film that are to be electrically isolated from one another.

It should be noted that in the immediate vicinity of the openings 32, only the aluminium layer exists and therefore, if the isolation groove is formed close to the openings 32, where it passes close to the openings 32 it may only pass through the aluminium layer. It is preferable, however, to form the isolation groove through the region where both metal layers are present to gain the advantage of the lower adhesion of nickel to Novolac™.

A portion of the completed structure is illustrated in FIG. 6 which shows the connection of an n-type contact of one cell to the p-type contact of an adjacent cell to provide a series connections of cells.

A second embodiment of the invention will now be described with reference to FIGS. 7 to 11 in which, FIG. 7 again, illustrates a part of a semiconductor device structure 111 which is a precursor to the process of the present invention with a first step of the invention applied. As with the previous embodiment, the semiconductor device is a photovoltaic module comprising a thin polycrystalline silicon film 112 formed on a glass substrate 122 covered with a thin anti-reflection coating. However, in this embodiment the doped regions are swapped with the lower region 115 being a $p^{++}$ region, and the upper region 113 being an n type region. An intrinsic or lightly doped region 114 again separates the n and p-type regions. The silicon film 112 is separated into cells by scribed isolation grooves 116.

As with the previous embodiment, the first step of the method according to the present invention, is the formation of a dielectric layer 117 over the thin silicon film 112. Preferably, the dielectric layer is a two layer film composed of a thin (150 nm) layer of silicon nitride plus an organic resin known as Novolac™, which is formed to a thickness in the order of 2.5 μm.

A first set of holes 119 (ref FIG. 8) are then formed in the dielectric layer 117 by heating the regions to be opened with a laser 118. The laser 118 is employed to open holes through the dielectric layer 117, and semiconductor layers 113, 114, 115 to form an opening 119, as is illustrated in FIG. 8, extending through the silicon film 112 to the glass substrate 122.

As also illustrated in FIG. 8, the silicon surfaces 125 exposed by the opening 124, are doped with p-type dopant as a result of the laser process which forms the hole 126, to isolate the opening 119 from the n-type region 113 and to provide a surface for formation of the p-type contact. The walls become doped p-type because in these regions during the laser pulse, the semiconductor film is melted and all dopants in the film are mixed together. Because there are more p-type dopants in the film that n-type dopants, the walls of the hole solidify with p-type polarity.

Turning to FIG. 9, a thin metal layer 123 is then deposited over the dielectric layer 117 and extends into the holes 119 to contact with the p-type region 115 via the doped wall regions 125. The thin metal layer 123 is preferably of nickel, or copper and is typically in the order of 10 nm, serving both as the contact to the p-type region 115 and as a back reflector. Copper is a superior optical reflector to nickel and both metals make reliable contacts with p-type silicon. However, nickel does not adhere to Novolac™ as strongly as does copper, a fact which assists in subsequent formation of metal isolation grooves.

A laser 124 (refer to FIG. 9) is used to open holes 127 through the thin metal layer 123 and the dielectric layer 117. The laser 127 locally heats the underlying silicon which causes the Novolac™ to erupt leaving a hole 119 exposing the silicon beneath. Heat treatment can be used subsequently to smooth the edge of the dielectric layer surrounding the hole if necessary.

When the opening 132 is formed, the very thin metal layer 123 in the vicinity of the opening is caused to evaporate from the area surrounding the opening 132 such that the opening in the metal layer 123 is 2–3 times the diameter of the openings in the dielectric 117.

Figure 11:
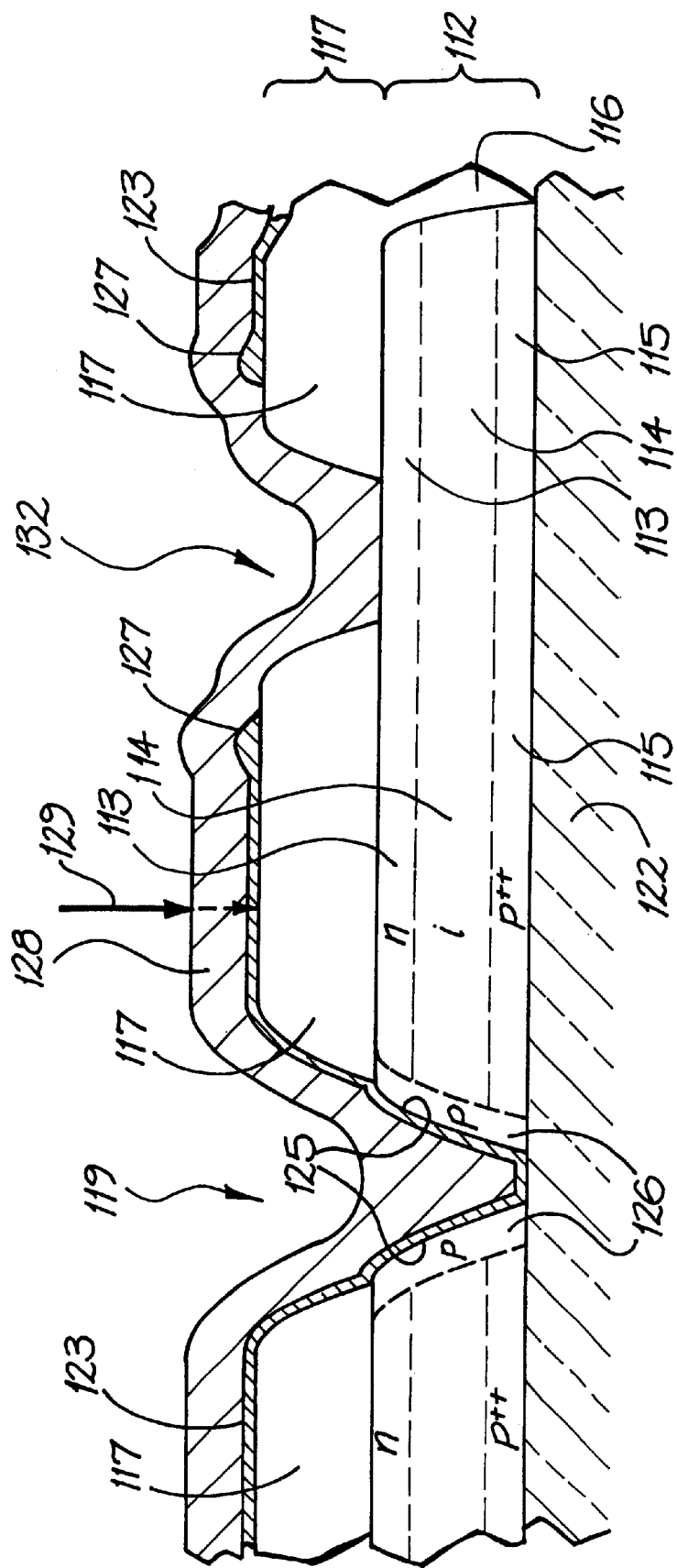
FIG. 11 is a sectional view through a semiconductor device after a second metallisation step of the invention has been applied according to the second embodiment.

Referring to FIG. 11, the n-type contact is formed by a second thin metal layer 128 formed over the first thin metal layer 123, the second metal layer 128 extending into the opening 132 and contacting the surfaces of the n-type layer 113.

As with the previous embodiment, the openings 116 and 119 are either elongate grooves or spaced holes so that lateral continuity is maintained in the semiconductor layer.

The final step in the process is the isolation of the n-type and p-type contacts which is achieved by using a laser 129 (see FIG. 11) to melt and/or evaporate the metal layers 123 and 128 to thereby form an isolation similar to groove 31 as seen in FIG. 6.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method of forming p-type and n-type contacts on a thin film semiconductor junction device having an underlying region of a first semiconductor type and an overlying region of a second semiconductor type including the steps of:
    a) forming at least one dielectric layer over a free surface of the thin film device;
    b) opening a first set of holes in the dielectric layer to expose the upper semiconductor region of the second semiconductor type in the locations where contacts are to be made to the second semiconductor type;
    c) forming a first thin metal layer over the at least one dielectric layer and extending into the first set of openings to contact with the second semiconductor type, the first metal layer being formed of a metal selected to reliably make electrical connection with the second semiconductor type;
    d) opening a second set of holes through the first metal layer and the dielectric layer to expose a surface of the semiconductor;
    e) doping the surface or surfaces of the semiconductor device exposed by the second set of holes in the dielectric layer with a dopant of the same polarity as the underlying region, the doping of the exposed surface or surfaces extending to the underlying region and isolating internal surfaces of the second set of holes from the upper semiconductor region;
    f) forming a second thin metal layer over the first metal layer, the second metal layer extending into the openings in the at least one dielectric layer and contacting the surface or surfaces of the semiconductor material exposed by the second set of holes to thereby provide a connection to the underlying semiconductor region; and
    g) for each cell in the device, forming an isolation groove through both metal layers to electrically isolate the contacts in the first set of openings from the contacts in the second set of openings.

2. The method of claim 1 wherein the doping step, to dope the second set of holes is a subsequent process step to the step of opening the holes.

3. The method of claim 1 wherein the doping of the surfaces of the second set of holes is performed as part of the step of opening the holes.

4. The method of claim 1, wherein the step of opening the second set of holes comprises directing a laser at each location where the holes are to be made and using the laser to form the respective hole.

5. The method of claim 4 wherein the doped walls of the opening are formed by a mixing of the material from the underlying region with the material in the walls of the hole during the formation of each hole.

6. The method of claim 1, wherein the opening created by the second opening step extends through the first metal layer, the one or more dielectric layers and through the semiconductor film to expose a supporting surface on which the semiconductor film is formed.

7. The method of claim 1, wherein the step of opening the second set of holes comprises forming a mask which leaves exposed only those areas where holes are to be formed and applying an etchant material to etch the holes through the first metal layer, the dielectric and into the semiconductor material.

8. The method of claim 1, wherein the step of opening the second set of holes comprises mechanically scribing the holes through the first metal layer, the at least one dielectric layer and into the semiconductor material.

9. The method as claimed in claim 1, wherein the first metal layer is formed using a material selected for good optical reflectivity.

10. The method as claimed in claim 1, wherein the step of forming the first metal layer comprises forming a layer which is sufficiently thin to be transparent, and the step of forming the second metal layer comprises applying a layer of a material selected for good optical reflectivity.

11. The method as claimed in claim 1, wherein the metal layers are each formed from a material selected from aluminium, copper and nickel.

12. The method of claim 11 wherein the first metal layer is formed using a material selected from nickel and copper.

13. The method of claim 12 wherein the second metal layer is formed using aluminium.

14. The method as claimed in claim 1, wherein the step of forming the at least one dielectric layer comprises applying a layer of a material selected from silicon dioxide, silicon nitride, an organic resin, or applying a layered combination of these materials.

15. The method as claimed in claim 1, wherein the step of forming at least one dielectric layer comprises forming a first layer of silicon nitride and a second layer of Novolac.

16. The method as claimed in claim 1, wherein the at least one dielectric layer is formed to a thickness an order of magnitude thicker than the second metal layer.

17. The method as claimed in claim 1, wherein the second metal layer is formed to a thickness an order of magnitude thicker than the first metal layer.

18. The method as claimed in claim 1, wherein the silicon film is formed to a thickness in the range of 0.5–10 μm thick.

19. The method as claimed in claim 1, wherein the silicon film is formed over a glass substrate.

20. The method as claimed in claim 19 wherein the silicon film is in the range of 1–3 μm thick.

21. The method as claimed in claim 20 wherein the dielectric layer is formed using Novolac.

22. The method as claimed in claim 21 wherein the step of forming one or more dielectric layers comprises forming a thin layer of silicon nitride over the semiconductor material before forming the Novolac layer.

23. The method of claim 22 wherein the silicon nitride layer is formed to a thickness in the range of 100–200 nm.

24. The method as claimed in claim 23 wherein the Novolac layer is formed to be in the range of 1–10 μm.

25. The method as claimed in claim 24 wherein the Novolac layer is formed to be in the range of 2–5 μm.

26. The method as claimed in claim 25 wherein the first metal layer is formed to be in the range of 5–20 nm.

27. The method as claimed in claim 26 wherein the second metal layer is formed to be in the range of 100–200 nm thick.

28. A method of forming p-type and n-type contacts on a thin film semiconductor junction device having an underlying region of a first semiconductor type and an overlying region of a second semiconductor type including the steps of:
   a) forming at least one dielectric layer over a free surface of the thin film device;
   b) opening a first set of holes through the at least one dielectric layer to expose a surface of the semiconductor in the locations where contacts are to be made to the underlying region of the first semiconductor type;
   c) doping the surface or surfaces of the semiconductor device exposed by the first set of holes in the at least one dielectric layer with a dopant of the same polarity as the underlying region, the doping of the exposed surface or surfaces extending to the underlying region and isolating internal surfaces of the first set of holes from the upper semiconductor region;
   d) forming a first thin metal layer over the at least one dielectric layer and extending into the first set of openings to contact with the first semiconductor type, the first metal layer being formed of a metal selected to reliably make electrical connection with the first semiconductor type;
   e) opening a second set of holes through the first metal layer and the at least one dielectric layer to expose the upper semiconductor region of the second semiconductor type in the locations where contacts are to be made to the second semiconductor type;
   f) forming a second thin metal layer over the first metal layer, the second metal layer extending into the openings in the at least one dielectric layer and contacting the surface or surfaces of the semiconductor material exposed by the second set of holes to thereby provide a connection to the upper semiconductor region; and
   g) for each cell in the device, forming an isolation groove through both metal layers to electrically isolate the contacts in the first set of openings from the contacts in the second set of openings.

29. The method of claim 28 wherein the doping step, to dope the first set of openings is a subsequent process step to the opening step.

30. The method of claim 28 wherein the doping of the surfaces of the second set of openings is performed as part of the opening step.

31. The method of claim 28, wherein the step of opening the first set of holes comprises directing a laser at each location where the openings are to be made and using the laser to form the respective opening.

32. The method of claim 31 wherein the doped walls of each of the first set of opening are formed by a mixing of the material from the underlying region with the material in the walls of the hole during the formation of each hole.

33. The method of claim 28, wherein the opening created by the first opening step extends through the one or more dielectric layers and through the semiconductor film to expose a supporting surface on which the semiconductor film is formed.

34. The method of claim 28, wherein the step of opening the first set of holes comprises forming a mask which leaves exposed only those areas where holes are to be formed and applying an etchant material to etch the holes through the first metal layer, the dielectric and into the semiconductor material.

35. The method of claim 28, wherein the step of opening the first set of holes comprises mechanically scribing the holes through the first metal layer, the at least one dielectric layer and into the semiconductor material.

36. The method as claimed in claim 28, wherein the first metal layer is formed using a material selected for good optical reflectivity.

37. The method as claimed in claim 28, wherein the step of forming the first metal layer comprises forming a layer which is sufficiently thin to be transparent, and the step of forming the second metal layer comprises applying a layer of a material selected for good optical reflectivity.

38. The method as claimed in claim 28, wherein the metal layers are each formed from a material selected from aluminium, copper and nickel.

39. The method of claim 38 wherein the first metal layer is formed using a material selected from nickel and copper.

40. The method of claim 38 wherein the second metal layer is formed using aluminium.

41. The method of claim 28, wherein the step of forming the at least one dielectric layer comprises applying a layer of a material selected from silicon dioxide, silicon nitride, an organic resin, or applying a layered combination of these materials.

42. The method of claim 28, wherein the step of forming at least one dielectric layer comprises forming a first layer of silicon nitride and a second layer of Novolac.

43. The method as claimed in claim 28, wherein the at least one dielectric layer is formed to a thickness an order of magnitude thicker than the second metal layer.

44. The method as claimed in claim 28, wherein the second metal layer is formed to a thickness an order of magnitude thicker than the first metal layer.

45. The method as claimed in claim 28, wherein the silicon film is formed to a thickness in the range of 0.5–10 μm thick.

46. The method as claimed in claim 28, wherein the silicon film is formed over a glass substrate.

47. The method as claimed in claim 46 wherein the silicon film is in the range of 1–3 μm thick.

48. The method as claimed in claim 47 wherein the dielectric layer is formed using Novolac.

49. The method as claimed in claim 48 wherein the step of forming one or more dielectric layers comprises forming a thin layer of silicon nitride over the semiconductor material before forming the Novolac layer.

50. The method of claim 49 wherein the silicon nitride layer is formed to a thickness in the range of 100–200 nm.

51. The method as claimed in claim 50 wherein the Novolac layer is formed to be in the range of 1–10 μm.

52. The method as claimed in claim 51 wherein the Novolac layer is formed to be in the range of 2–5 μm.

53. The method as claimed in claim 52 wherein the first metal layer is formed to be in the range of 5–20 nm.

54. The method as claimed in claim 53 wherein the second metal layer is to be in the range of 100–200 nm thick.

55. A thin film semiconductor device comprising a thin semiconductor film formed on a transparent insulating substrate, the semiconductor film having at least an upper doped region of a first dopant type located adjacent an upper surface of the semiconductor film remote from the substrate, and an underlying doped region of a dopant type of opposite polarity to the first dopant type between the upper doped region and the substrate, at least one dielectric layer extending over the semiconductor film, a first thin layer of a first metal extending over the dielectric layer and a second thin layer of a second metal different to the first metal extending over and in contact with the first metal layer, a first set of openings being provided in the at least one dielectric layer such that the first metal layer contacts the semiconductor region of one dopant type to make electrical connection therewith in the first set of openings, and a second set of openings being provided in the at least one dielectric layer and the first metal layer such that the second metal layer extends into the second set of openings in the at least one dielectric layer and contacts a region of the semiconductor film, of the opposite dopant type, the first metal being selected to reliably make electrical connection with the semiconductor material exposed by the first set of openings and the second metal being selected to reliably make electrical connection with the semiconductor material exposed by the second set of openings.

56. The device of claim 55 wherein the second set of openings extends completely through the semiconductor film to expose a supporting surface of the transparent insulating substrate on which the semiconductor film is formed.

57. The device of claim 55 wherein the first metal layer forms a back reflector of the photovoltaic device.

58. The device of claim 55 wherein the first metal layer is formed from a material selected for good optical reflectivity.

59. The device of claim 55 wherein the first metal layer is sufficiently thin as to be transparent, and the second metal layer forms a back reflector of the photovoltaic device.

60. The device of claim 59 wherein the second metal layer is formed from a material selected for good optical reflectivity.

61. The device of claim 57, wherein the metal layers are each formed from a material selected from aluminium, copper and nickel.

62. The device of claim 61 wherein the first metal layer is formed from a material selected from nickel and copper.

63. The device of claim 61 wherein the second metal layer is formed of aluminium.

64. The device as claimed in claim 54, wherein the at least one dielectric layer comprises a material selected from silicon dioxide, silicon nitride, an organic resin, or a layered combination of these materials.

65. The device as claimed in claim 54, wherein the at least one dielectric layer comprises a first layer of silicon nitride and a second layer of Novolac.

66. The device as claimed in claim 54, wherein the at least one dielectric layer is an order of magnitude thicker than the second metal layer.

67. The device as claimed in claim 54, wherein the first metal layer is an order of magnitude thinner than the second metal layer.

68. The device as claimed in claim 54, wherein the silicon film is in the range of 0.5–10 μm thick.

69. The device as claimed in claim 54, wherein the silicon film is formed over a glass substrate.

70. The device as claimed in claim 69 wherein the silicon film is in the range of 1–3 μm thick.

71. The device as claimed in claim 70 wherein the dielectric layer is formed of Novolac.

72. The device of claim 71 wherein a thin layer of silicon nitride is formed between the Novolac and the silicon.

73. The device of claim 72 wherein the silicon nitride layer is in the range of 100–200 nm thick.

74. The device of claim 73 wherein the Novolac layer is in the range of 1–10 μm thick.

75. The device of claim 74 wherein the Novolac layer is in the range of 2–5 μm thick.

76. The device of claim 75 wherein the first metal layer is in the range of 5–20 nm thick.

77. The device of claim 76 wherein the second metal layer is in the range of 100–200 nm thick.

* * * * *